(12) United States Patent
Jacobson

(10) Patent No.: US 7,091,745 B1
(45) Date of Patent: Aug. 15, 2006

(54) INDICATING COMPLETION OF CONFIGURATION FOR PROGRAMMABLE DEVICES

(75) Inventor: Neil G. Jacobson, Los Altos, CA (US)

(73) Assignee: Xilinx, Inc., San Jose, CA (US)

( * ) Notice: Subject to any disclaimer, the term of this patent is extended or adjusted under 35 U.S.C. 154(b) by 66 days.

(21) Appl. No.: 10/853,403

(22) Filed: May 24, 2004

(51) Int. Cl.
H03K 19/177 (2006.01)
H01L 25/00 (2006.01)
G06F 7/38 (2006.01)

(52) U.S. Cl. .......................... 326/41; 326/39
(58) Field of Classification Search ................. 326/41, 326/39; 716/16; 719/16
See application file for complete search history.

(56) References Cited

U.S. PATENT DOCUMENTS 5,696,454 A * 12/1997 Trimberger ................. 326/38
5,910,732 A * 6/1999 Trimberger ................. 326/38
6,255,848 B1 * 7/2001 Schultz et al. .............. 326/41
6,874,107 B1 * 3/2005 Lesea ......................... 714/725

* cited by examiner

Primary Examiner—Rexford Barnie
Assistant Examiner—Jason Crawford
(74) Attorney, Agent, or Firm—LeRoy D. Maunu; Justin Liu

(57) ABSTRACT

Various approaches for indicating completion of configuration of programmable logic devices are disclosed. In one embodiment, a plurality of configuration memory cells are arranged for storage of a configuration bitstream for implementing a circuit design on the programmable logic circuit. A plurality of configurable resources are coupled to the configuration memory cells, and each configurable resource implements a function based on data stored in one or more of the configuration memory cells coupled to the configurable resource. A logic circuit is coupled to a subset of the configuration memory cells and is configured to assert a done signal in response to states of the subset of the configuration memory cells.

11 Claims, 5 Drawing Sheets

INDICATING COMPLETION OF CONFIGURATION FOR PROGRAMMABLE DEVICES

FIELD OF THE INVENTION

The present invention generally relates to configuring programmable devices.

BACKGROUND

The IEEE standard 1532 describes an approach for in-system configuration of devices such as programmable logic devices (PLDs). The standard seeks to provide system designers with predictability of operations of configurable devices.

Part of the predictability includes describing the expected behavior of the device when it is incompletely configured. Example situations in which configuration may not complete include loss of power and signal interruption or electrical interference. When power is restored to the device, the user should not have to be concerned with damaging the device or system because of an incomplete configuration.

Among other requirements, the standard generally requires a device to assert an internally generated done signal after configuration is complete and hold the state of the done signal during the time that the device is operational. Based on the state of the done signal, damage to various components in the system may be avoided by aborting a power-up sequence if necessary.

The standard does not require, however, that the state of the done signal be associated with a correct configuration of the device, as compared to an incomplete configuration. Thus, there remains some risk that system damage might result when an improperly configured device asserts a done signal.

The present invention may address one or more of the above issues.

SUMMARY OF THE INVENTION

The various embodiments of the invention provide various approaches for indicating completion of configuration of programmable logic circuits. In one embodiment, a plurality of configuration memory cells are arranged for storage of a configuration bitstream for implementing a circuit design on the programmable logic circuit. A plurality of configurable resources are coupled to the configuration memory cells, and each configurable resource implements a function based on data stored in one or more of the configuration memory cells coupled to the configurable resource. A logic circuit is coupled to a subset of the configuration memory cells and is configured to assert a done signal in response to states of the subset of the configuration memory cells.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

Various embodiments of the present invention are described in terms of a done signal associated with completing configuration of a field programmable gate array (FPGA). Those skilled in the art will appreciate, however, that the invention may be implemented in different FPGA architectures, other types of programmable logic devices (PLDs) other than FPGAs, integrated circuits that include programmable logic circuitry and/or adapt to various application requirements, based on both volatile and non-volatile technologies.

Figure 1:
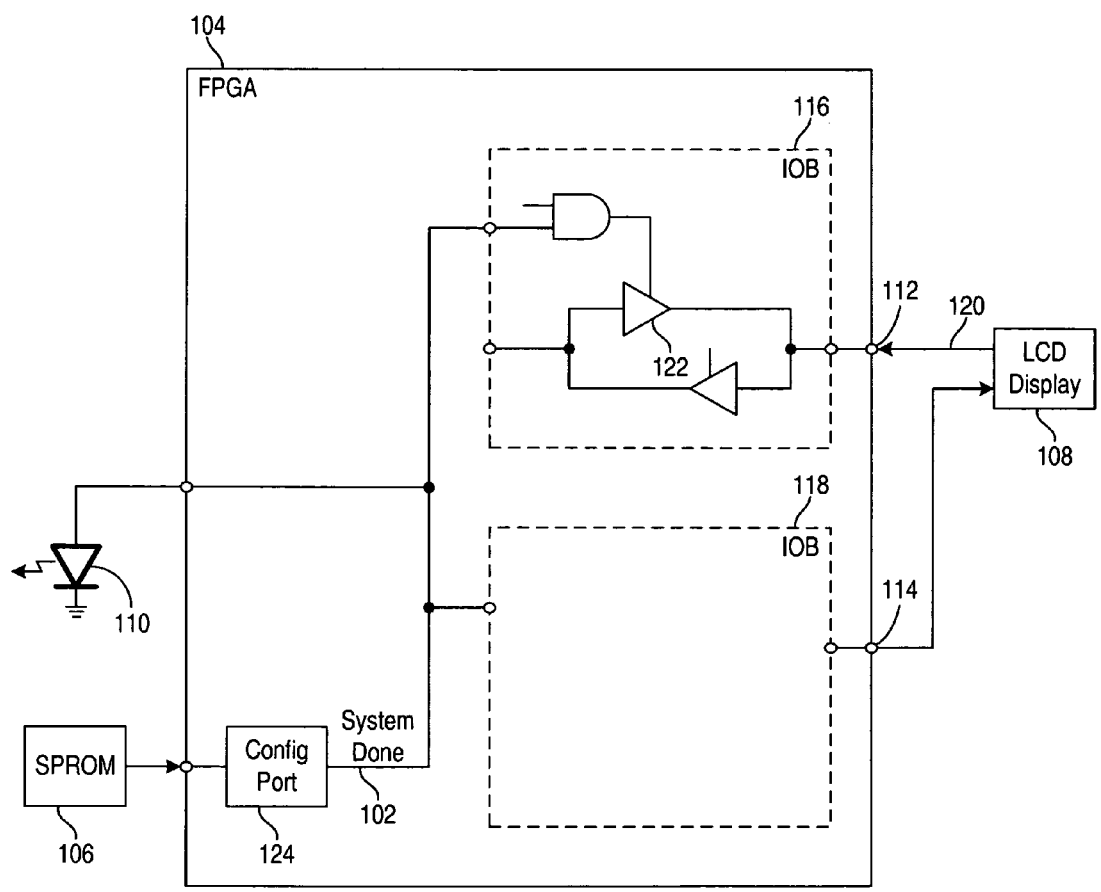
FIG. 1 illustrates an example system in which a system done signal protects the system from damage.

FIG. 1 illustrates an example system in which a system done signal on line 102 protects the system from damage. The system includes an FPGA 104 configured from a serial PROM 106 and an example device, such as LCD display 108, coupled to an output port and an input port of the FPGA. An LED 110 may be included to provide a visible indication of the state of the system done signal 102.

A programmable logic device (PLD) such as FPGA 104 may be configured to perform a variety of functions. In addition, the FPGA includes general purpose input/output pins that are configurable, for example, pins 112 and 114. A general purpose input/output pin 112 or 114 may be configurable as an input, an output, or a bidirectional pin. Each general purpose input/output pin 112 and 114 is coupled to a respective input/output block (IOB) 116 and 118 of FPGA 104. For the configured system, IOB 116 is configured to make pin 112 an input and IOB 118 is configured to make pin 114 an output, to communicate with the LCD display 108.

A partial or improper configuration may instead configure IOB 116 to make pin 112 an output. This may cause a drive fight (or contention) at line 120 with, for example, the LCD display 108 trying to drive line 120 to a high level while FPGA 104 is trying to drive line 120 via pin 112 to a low level. The drive fight at line 120 may cause excessive current draw through the LCD display 108 driver for line 120 or the FPGA 104 driver 122 for line 120. The excessive current draw may permanently damage LCD display 108 and/or the FPGA driver 122.

One use for the system done signal 102 is to prevent drive fights at general purpose input/output pins due to a partial configuration. A configuration port 124 may deassert the system done signal 102 at power-up of the FPGA 104 and assert the system done signal 102 at the completion of loading of configuration data from serial PROM 106. During configuration and while the system done signal 102 is deasserted, driver 122 may be forced into a disabled high impedance state to prevent a drive fight at line 120. All IOB 116 and 118 may have similar logic. The deasserted done signal may also be used internally to force a device to behave as if no configuration occurred, regardless of the state of the configuration memory The system done signal 102 may reflect the system done state mandated for a PLD complying with IEEE standard 1532. The IEEE standard 1532 mandates that the PLD be placed in a benign state prior to reaching the system done state.

Figure 2:
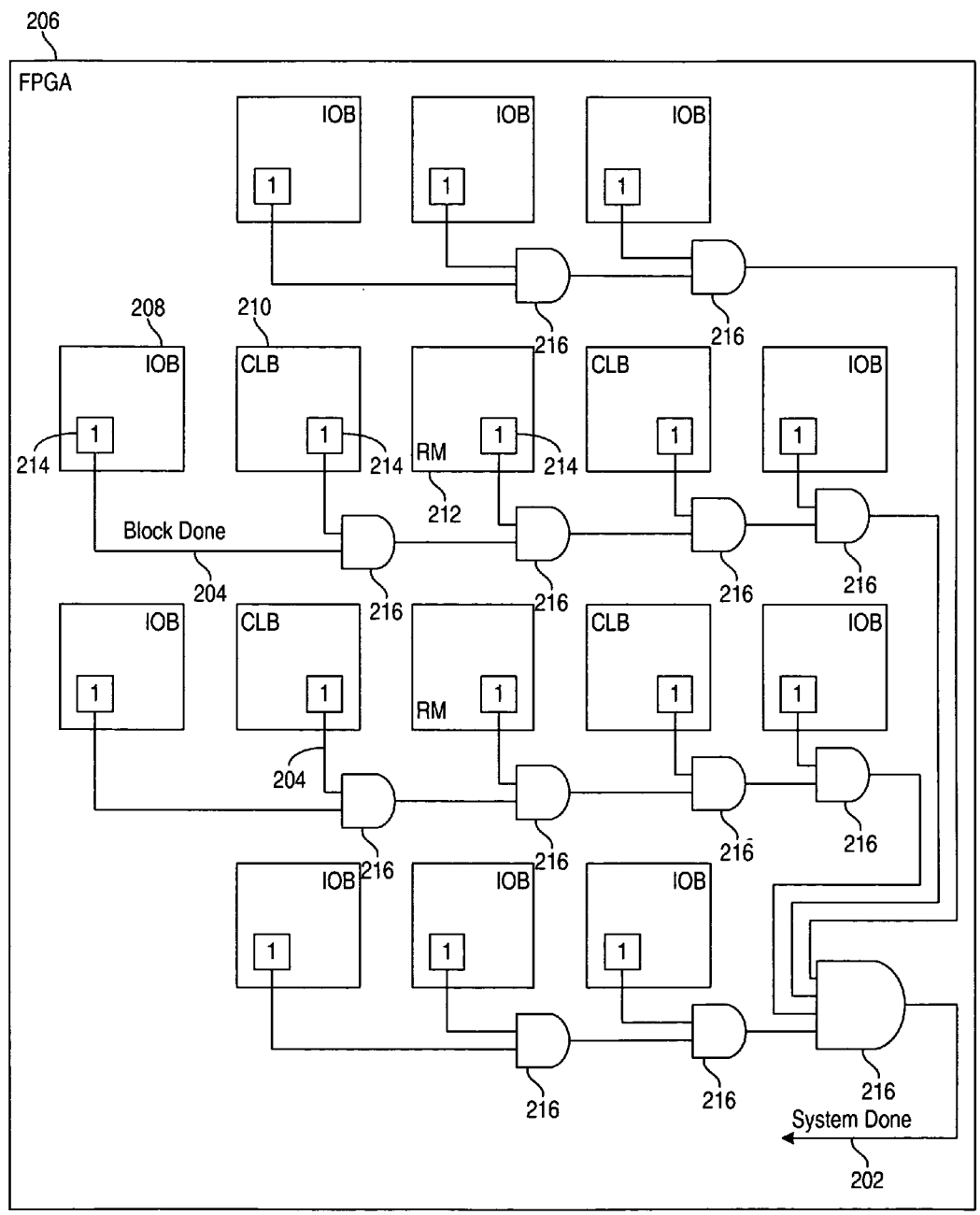
FIG. 2 is a block diagram of an FPGA in which a system done signal is generated from done signals from for various configurable blocks in accordance with various embodiments of the invention.

FIG. 2 is a block diagram of an FPGA in which a system done signal on line 202 is generated from done signals on lines 204 for various configurable blocks in accordance with various embodiments of the invention. The general configurable resources of an example FPGA 206 include and are illustrated as blocks of types IOB 208, configurable logic block 210 (CLB), and routing matrix 212 (RM). Each block 208, 210, and 212 contains configuration memory cells that are used in configuring the function of the block. The configuration memory for each block 208, 210, and 212 may also include a block done cell 214. In one embodiment, a block done cell 214 is dedicated to the function of generating the block done signal 204. Alternatively, a block done cell 214 may contribute to the configuration of the function of the block. The block done signal for each block 208, 210, and 212 reflects the value of the respective block done cell 214. It will be appreciated that other FPGA architectures may have configurable resources arranged in blocks other than the CLBS, IOBs and routing matrix of the example FPGA, and the block done cells may be associated with implementation-suitable combinations of the other types of blocks. Furthermore, in other embodiments, one or more block done cells may be associated with a group of blocks of differing types.

The default value after FPGA 206 power-up reset may be 0 for all configuration memory cells including the block done cells 214. A tree of AND gates, e.g., including AND gates 216, which may be a balanced tree, generates the system done signal on line 202 from the logical AND of all the individual block done signals 204. While any block done cell 214 retains the default value of 0, the system done signal 202 remains at a value of 0. The block done cell 214 for a block 208, 210, and 212 is set to 1 during configuration when the block is fully configured. Only after all blocks 208, 210, and 212 have completed configuration does the system done signal 202 become asserted.

The generation of the system done signal 202 provides the feedback that the configuration data was actually received by every block 208, 210, and 212 before the system done signal 202 is asserted.

Figure 3:
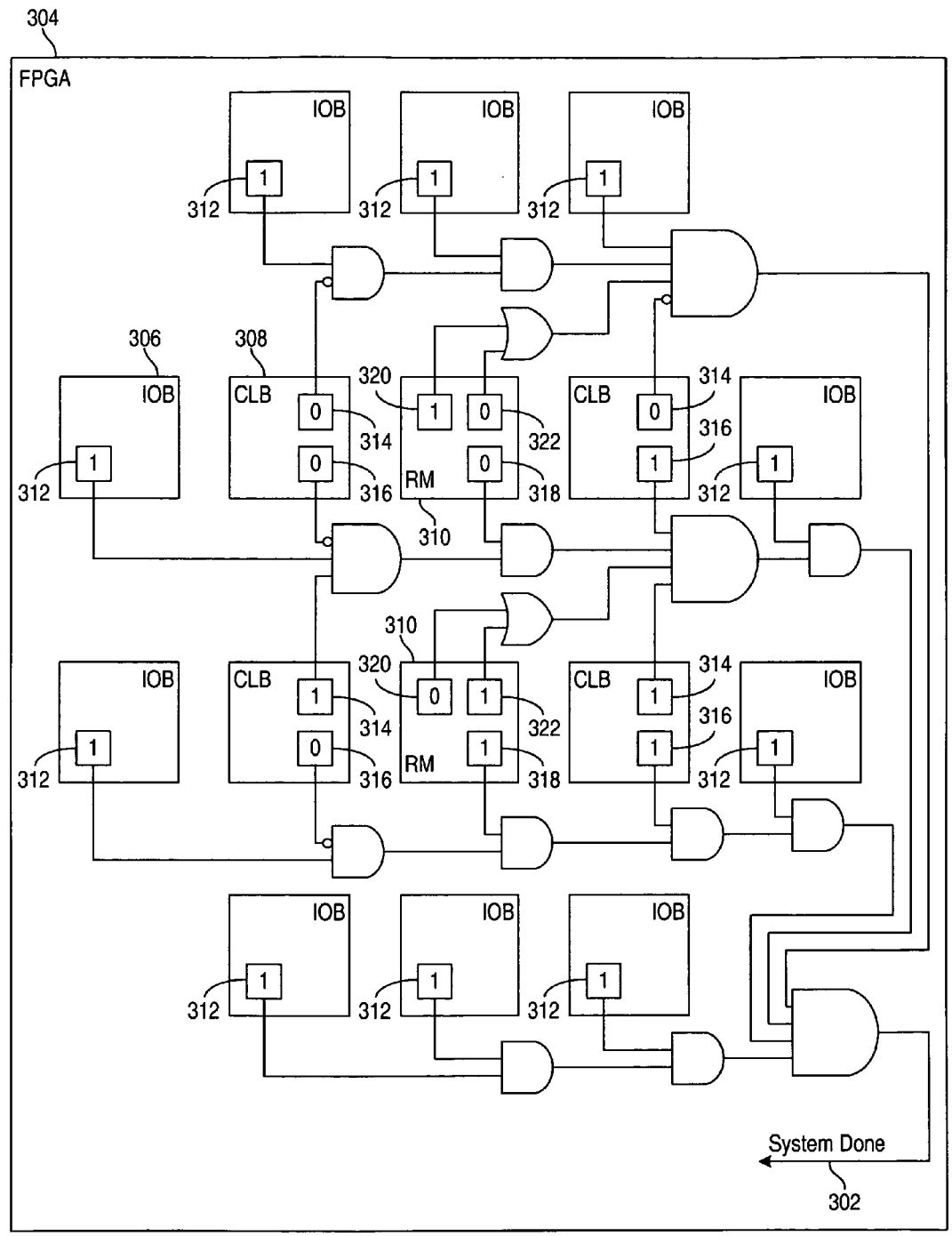
FIG. 3 is a block diagram of an example FPGA in which a system done signal is generated from a combination of status signals for the blocks in accordance with various embodiments of the invention.

FIG. 3 is a block diagram of an example FPGA in which a system done signal is generated on line 302 from a combination of status signals for the blocks in accordance with various embodiments of the invention. FPGA 304 has blocks IOB 306, CLB 308, and RM 310 with each block containing configuration memory cells to configure the function of the block. Certain ones of the configuration memory cells, for example, configuration memory cells 312, 314, 316, 318, 320, and 322 participate in the generation of the system done signal 302.

Each IOB 306 may have a configuration memory cell 312 that has a default value of 0 on power-up reset and is configured with a value of 1 when the function of the IOB 306 is configured by the loading of configuration data. A memory cell 312 may contribute to the function of an IOB 306, for example, by enabling the power supplies for IOB 306 circuitry after completion of IOB 306 configuration.

Each CLB may have one or more configuration memory cells that are used in generating the system done signal. For example, memory cells 314 and 316 from CLB 308 are used. For a particular CLB, such as CLB 308, the logic for assertion of system done 302 may require specific values to be configured into the memory cells 314 and 316. These specific values form a key that provide a positive indication that CLB 308 is configured. The key value for each CLB may be the same or different depending on application or implementation requirements. An improper configuration may be unlikely to generate an asserted system done signal, thereby reducing the likelihood of an erroneous done signal, when a variety of key values are used.

An RM block 310 may have a memory cell 318 that must be configured with a specific key value, depending on the particular RM block, before system done 302 may be asserted. An RM block may additionally include memory cells 320 and 322, with memory cell 320 set to a value of 1 when the RM 310 is configured for normal operation, and memory cell 322 set to a value of 1 when the RM 310 is configured in a powered down state. When an RM block is unused, the RM block may be configured in a powered down state. An RM block enables assertion of the system done signal when the RM block is either configured for normal operation or configured in a powered down state.

Figure 4:
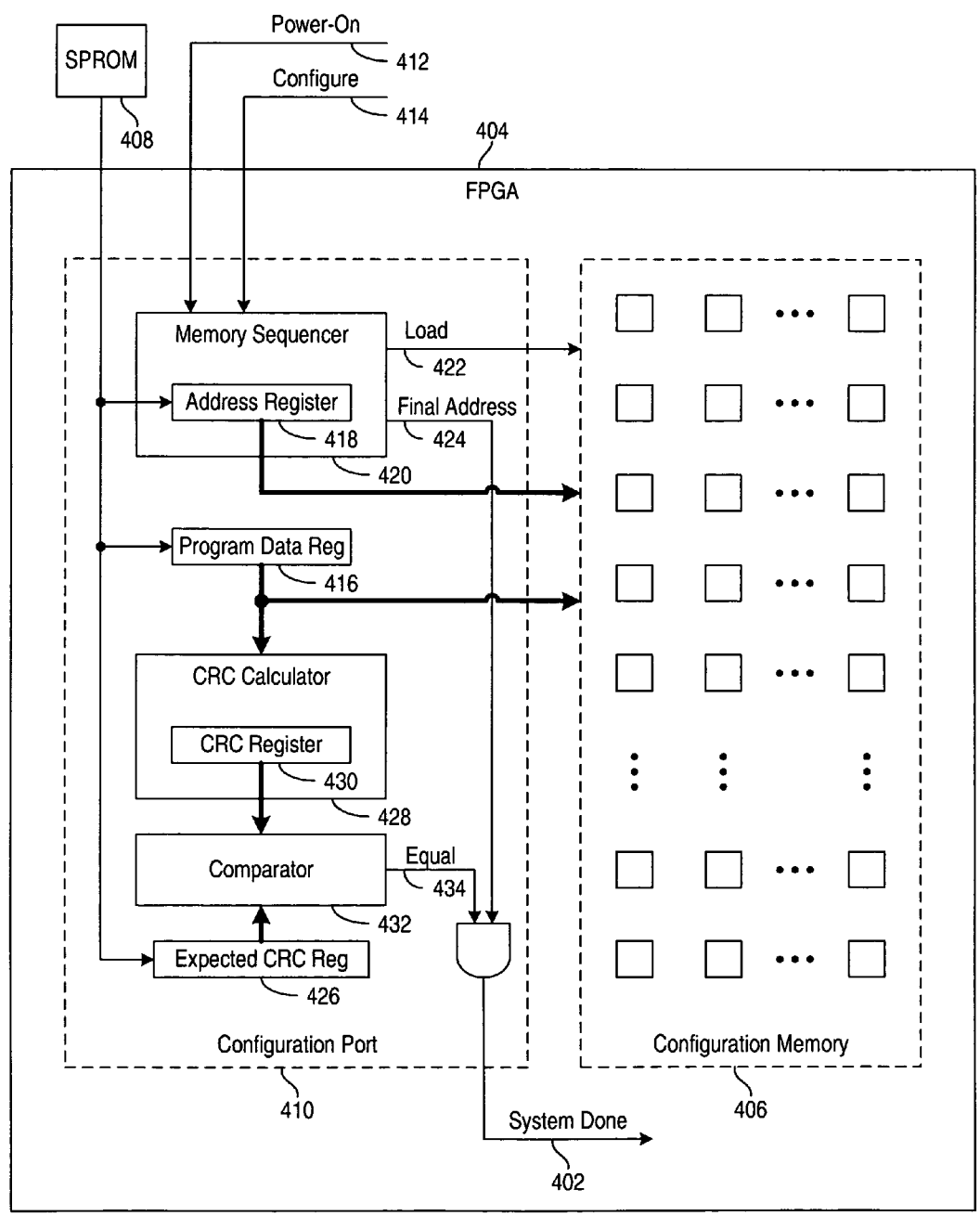
FIG. 4 is a block diagram of an example FPGA in which a system done signal is generated from a cyclic redundancy code (CRC) calculated over the configuration data in accordance with various embodiments of the invention.

FIG. 4 is a block diagram of an example FPGA in which a system done signal is generated from a cyclic redundancy code (CRC) calculated over the configuration data in accordance with various embodiments of the invention. At power-on, FPGA 404 is configured by loading configuration data into configuration memory 406 from serial PROM 408 via configuration port 410. The loading of configuration data from a configuration bitstream in the serial PROM 408 may be started by either a power-on input 412 or a configure input 414. Internal power-on detection may be provided in another embodiment.

Configuration port 410 loads each word of configuration data into configuration memory 406 via a program data register 416 at a location in configuration memory 406 specified by an address register 418. The configuration bitstream from serial PROM 408 may contain one or more blocks of configuration data words and a starting address for each block. The starting address for a block is used to initialize the address register 418, and the memory sequencer 420 may increment the address register 418 after each configuration data word is first loaded into the program data register 416 and then loaded into configuration memory 406. During the loading of configuration data, the memory sequencer 420 may assert a load signal 422 to write a word of configuration data from program data register 416 into configuration memory 406 at the location addressed by address register 418. The address sequencer 420 may assert the final address signal on line 424 when configuration is complete.

A CRC calculated over the configuration data may be included in the configuration bitstream from serial PROM 408. An expected CRC register 426 may be set during configuration with this CRC value from the configuration bitstream. As each word is written into configuration memory 406 from the program data register 416, a CRC calculator 428 may update a partial CRC result in CRC register 430 to reflect the word of configuration data in program register 416. A comparator 432 compares the contents of the CRC register 430 with the expected CRC register 426 and generates an equal signal 434 for matching CRC values. At the end of configuration when the final address 424 is asserted, the system done signal 402 is asserted for matching CRC values.

In another embodiment, after configuration memory 406 is configured from serial PROM 408, the memory sequencer 420 may read back the configuration data from configuration memory 406 to check the CRC. A readback register may hold a word of configuration data read from configuration memory 406 at the address provided by address register 418. Each successive value in the readback register is used by the CRC calculator 428 to update the partial CRC held in CRC register 430. The memory sequencer 420 generates the addresses in address register 418 during read back, and the final address signal 424 is asserted at the completion of reading back.

Figure 5:
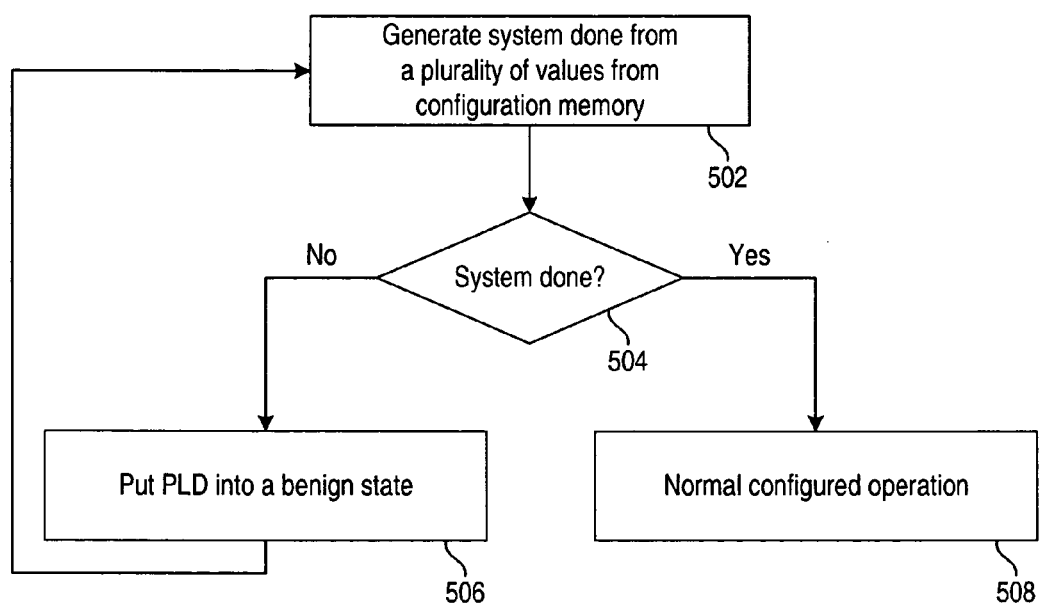
FIG. 5 is a flow diagram of an example process for usage of a system done signal in accordance with various embodiments of the invention.

FIG. 5 is a flow diagram of an example process for usage of a system done signal in accordance with various embodiments of the invention. At step 502, a system done signal is generated from a plurality of values from configuration memory of a programmable logic device (PLD). The values of a subset of some or all of the configuration memory cells may be used to generate system done. In one embodiment, a logical AND of values from configuration memory may be used to generate the system done signal. In another embodiment, a complex logic function may be used to generate system done. A complex logic function may contain at least one logical AND function and at least one logical OR function. A complex logic function may contain at least one logical XOR function in an alternative embodiment. The complex logic function may include a CRC calculation over the values of some or all of the configuration memory cells. A logical AND function may include an AND gate or a NAND gate; a logical OR function may include an OR gate or a NOR gate; and a logical XOR function may include an XOR gate or an XNOR gate.

In one embodiment, the system done signal is generated from values read directly or indirectly from selected cells of configuration memory. In another embodiment, the system done signal is generated from prospective values en route to being written into configuration memory.

Decision step 504 checks the value of the generated system done signal. While system done is not asserted the PLD is put into a benign state at step 506, including placing general purpose I/O drivers in a high-impedance state. Values from the configuration memory continue to generate the system done signal, and decision step 504 is repeated to check the generated system done signal. When system done is asserted, the configured operation of the PLD begins at step 508. Once asserted, the system done signal remains asserted until PLD power is interrupted or configuration memory is accessed again for reconfiguration or erasure.

The present invention is believed to be applicable to a variety of systems for configuring PLDs and particularly applicable and beneficial in reducing the risks associated with improperly configured PLDs. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A programmable logic circuit, comprising:
   a plurality of configuration memory cells arranged for storage of a configuration bitstream for implementing a circuit design on the programmable logic circuit,
   a subset of the plurality of configuration memory cells comprising a plurality of block done cells;
   a plurality of configurable resources coupled to the configuration memory cells, wherein each configurable resource implements a function based on data stored in one or more of the configuration memory cells coupled to the configurable resource,
   each of the configurable resources comprising at least one block done cell indicating whether the corresponding configurable resource is configured; and
   a logic circuit coupled to the subset of the configuration memory cells, the logic circuit configured to assert, in response to states of the subset of the configuration memory cells, a done signal that indicates a complete configuration of the programmable logic circuit.

2. The circuit of claim 1, wherein the configurable resources are arranged in at least first and second different types of blocks, each block including a subset of the configurable resources, and each memory cell in the subset of configuration memory cells being associated with a respective one of the blocks.

3. The circuit of claim 2, wherein the logic circuit includes logic gates that implement at least two different logic functions.

4. The circuit of claim 1, wherein the configurable resources are arranged in first, second, and third types of blocks, the first type including resources configurable to implement a logic function, the second type configurable to implement a input/output function, and the third type configurable to route signals between blocks of the first type and second type in the circuit, and each memory cell in the subset of configuration memory cells is associated with a respective one of the blocks.

5. The circuit of claim 1, wherein the logic circuit includes logic gates that implement at least two different logic functions.

6. The circuit of claim 5, wherein the configurable resources are arranged in at least first and second different types of blocks, each block including a subset of the configurable resources, and at least one of the respective blocks is associated with a plurality of configuration memory cells in the subset of configuration memory cells.

7. The circuit of claim 1, wherein the configurable resources are arranged in at least first and second different types of blocks, each block including a subset of the configurable resources, and at least one of the respective blocks is associated with a plurality of configuration memory cells in the subset of configuration memory cells.

8. The circuit of claim 1, wherein the logic circuit includes a cyclic redundancy check (CRC) calculator configured to generate a CRC value from the subset of configuration memory cells, compare the generated CRC value to an expected CRC value, and assert the done signal in response to the generated CRC value being equal to the expected CRC value.

9. A programmable logic circuit, comprising:
   a plurality of configuration memory cells arranged for storage of a configuration bitstream for implementing a circuit design on the programmable logic circuit;
   a plurality of configurable resources coupled to the configuration memory cells, wherein each configurable resource implements a function based on data stored in one or more of the configuration memory cells coupled to the configurable resource; and
   a cyclic redundancy check (CRC) calculator configured to generate a plurality of CRC values from the configuration bitstream corresponding to the plurality of configurable resources, compare the generated plurality of CRC values to a corresponding plurality of expected CRC values, and assert a done signal in response to each of the generated CRC values being equal to each of the corresponding expected CRC values.

10. An apparatus for configuring a programmable logic circuit, comprising:

means for configuring configuration memory cells of the programmable logic circuit with a configuration bitstream;

means for generating a plurality of CRC values from the configuration bitstream;

means for comparing the generated plurality of CRC values to a plurality of corresponding expected CRC values; and means for asserting a done signal in response to each of the generated CRC values being equal to each of the corresponding expected CRC values, the done signal indicating a complete configuration of the programmable logic circuit.

11. A method for configuring a programmable logic circuit, comprising:

configuring configuration memory cells of the programmable logic circuit with a configuration bitstream;

generating a plurality of CRC values from the configuration bitstream;

comparing the generated plurality of CRC values to a plurality of corresponding expected CRC values; and asserting a done signal, in response to each of the generated CRC values being equal to each of the corresponding expected CRC values, the done signal indicating a complete configuration of the programmable logic circuit.

* * * * *